(12) United States Patent
Akita et al.

(10) Patent No.: US 7,964,035 B2
(45) Date of Patent: *Jun. 21, 2011

(54) CRYSTALLIZATION APPARATUS AND CRYSTALLIZATION METHOD

(75) Inventors: Noritaka Akita, Kyoto (JP); Yoshio Takami, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 888 days.

This patent is subject to a terminal disclaimer.

(21) Appl. No.: 11/925,389

(22) Filed: Oct. 26, 2007

(65) Prior Publication Data
US 2008/0293258 A1 Nov. 27, 2008

(30) Foreign Application Priority Data
May 24, 2007 (JP) ................................. 2007-137574

(51) Int. Cl.
*C30B 11/14* (2006.01)

(52) U.S. Cl. ............. 117/201; 117/202; 117/41; 117/42
(58) Field of Classification Search .................. 117/201, 117/202, 41, 42
See application file for complete search history.

(56) References Cited

U.S. PATENT DOCUMENTS
2005/0266591 A1* 12/2005 Hideo ............................ 438/22
2006/0087922 A1* 4/2006 Cheong et al. ............. 369/13.01

FOREIGN PATENT DOCUMENTS
| CN | 1497684 A | 5/2004 |
| CN | 1691278 A | 11/2005 |
| JP | 2000-068520 | 3/2000 |
| JP | 2002-261015 | 9/2002 |
| JP | 2005-294801 | 10/2005 |
| JP | 2006-066462 | 3/2006 |

* cited by examiner

Primary Examiner — Robert M Kunemund
(74) Attorney, Agent, or Firm — J.C. Patents

(57) ABSTRACT

A crystallization apparatus is provided. The crystallization apparatus includes a visible light source capable of obtaining high energy density output therein. A visible light irradiation system is formed by a plurality of visible laser beam sources arranged in a two-dimensional array. The visible light irradiation system includes a light intensity distribution forming apparatus for patterning light intensity distribution of a plurality of visible laser beams emitted by each visible laser beam source, and an imaging optical system for imaging the light having the light intensity distribution patterned by the light intensity distribution forming apparatus onto an irradiated region on the processed substrate. The visible laser beams emitted by a plurality of solid lasers or semiconductor lasers are overlapped in the light intensity distribution forming apparatus that satisfies an imaging position relationship in an optical axis with respect to the processed substrate.

5 Claims, 8 Drawing Sheets

CRYSTALLIZATION APPARATUS AND CRYSTALLIZATION METHOD

CROSS-REFERENCE TO RELATED APPLICATION

This application claims the priority benefit of Japanese application serial no. 2007-137574, filed May 24, 2007. All disclosure of the Japanese application is incorporated herein by reference.

BACKGROUND OF THE INVENTION

1. Field of the Invention

The present invention relates to a crystallization apparatus, and the crystallization apparatus uses light rays on amorphous or polycrystalline semiconductor thin film, so as to melt and crystallize the amorphous or polycrystalline semiconductor thin film. More particularly, the present invention relates to a crystallization technology, i.e., phase modulated excimer laser annealing (PMELA), and in the crystallization technology, a laser beam having a light intensity distribution obtained by phase modulation is irradiated on a non-single crystal semiconductor thin film, so as to crystallize the non-single crystal semiconductor thin film.

2. Description of Related Art

A technology of crystallizing a non-crystallized semiconductor layer formed on an insulator such as a glass substrate, so as to obtain a crystallized semiconductor layer and form a thin film transistor (TFT) with the crystallized semiconductor layer as an active layer, is known.

For example, in an active matrix liquid crystal display (LCD) apparatus, a semiconductor film such as a silicon film is disposed, a TFT is formed on the glass substrate, and the TFT is used as a switching device for switching display.

The step of forming the TFT includes the step of crystallizing non-single crystal semiconductor thin film such as amorphous or polycrystalline semiconductor thin film. For the crystallization technology, for example, laser crystallization technology is well known, and in the laser crystallization technology, a short pulse laser beam with high energy is used to melt the irradiated region of the non-single crystal semiconductor thin film and to crystallize the irradiated region.

Recently, laser crystallization apparatus used for production adopts a laser beam of lengthwise light beam (e.g. 500 μm*300 mm) with uniform intensity distribution to irradiate the amorphous silicon. However, for this method, the grain size of the obtained semiconductor film is smaller than or equal to 0.5 μm, and the grain size is relatively small. Therefore, a grain boundary exists in a channel region of TFT, so the performance of the TFT has limits, for example, the characteristics of the TFT are restrained.

In order to improve the performance of the TFT, a technology for manufacturing high quality semiconductor film having large grain is required. For the crystallization method satisfying the requirement, in various laser crystallization technologies, the following technology is particularly concerned. An excimer laser beam with the light intensity distribution of inverted wave peak pattern formed after phase modulation is irradiated to the non-single crystal semiconductor thin film, so as to crystallize the non-single crystal semiconductor thin film.

The method of irradiating the laser beam with the uniform intensity distribution to the amorphous silicon without performing the phase modulation is referred to as an excimer laser annealing (ELA) technology. The technology of performing crystallization after irradiating the excimer laser beam which is phase-modulated is referred to as PMELA technology. The excimer laser beam with specified light intensity distribution is irradiated to the non-single crystal semiconductor thin film, such that the irradiated portion of the semiconductor film is melted, and the irradiated portion of the semiconductor film is crystallized.

A light modulation device such as a phase modulation device is used, for example, a phase modulation device such as a phase shifter is used to perform phase modulation for the incident laser beam, so as to obtain the excimer laser beam with a specified light intensity distribution. The non-single crystal semiconductor thin film is, for example, amorphous silicon thin film or polycrystalline silicon thin film formed on the glass substrate.

In recently developed the PMELA technology, the excimer laser beam is irradiated once to melt and crystallize the region with a size of several millimeters square. Through the crystallization process of the non-single crystal semiconductor thin film, a crystallized silicon thin film (for example, please refer to non-patent document 1) having relatively same grains and size of approximately several microns to 10 microns is formed. The TFT manufactured on the crystallized silicon thin film formed by the method has excellent electrical characteristics.

The PMELA crystallization technology has the following excellent characteristics. That is, the using efficiency of the laser beam is high, such that it is possible to obtain crystals of grains with large grain diameter. However, in order to obtain stable electrical characteristics, it is necessary to accurately position the grains. In order to crystallize the semiconductor film of a large area, an irradiation technique called the step-and-repeat irradiation is used. According to the step-and-repeat irradiation technique, the following steps are performed repeatedly. That is, after the non-single crystal semiconductor film is irradiated with the laser beam, the glass substrate is moved to the next irradiating position and stops. Then, the non-single crystal semiconductor film is irradiated with the laser beam again.

In the PMELA crystallization technology, in order to evaluate the melting and the crystallizing states in a micro-region of the silicon thin film, it is required to observe the micro-region. For optically observing the crystallization process, the following technology is provided. That is, the illumination optical system used for observation is disposed to observe after the pulse energy light beam is irradiated (for example, please refer to patent document 1).

FIG. 8 is a view of a construction example of a crystallization apparatus for crystallizing by using PMELA. In FIG. 8, the crystallization apparatus 100 has an optical system 101 used for crystallization. The optical system 101 applied for crystallization forms light pattern used to perform the crystallization of grains with large grain diameter. The optical system 101 used for crystallization includes a laser beam source 111, a beam expander 112, a homogenizer 113, a phase shifter (e.g., a phase modulation device) 114, an imaging optical system 115, and a stage 140. The stage 140 guides the substrate 130 to a pre-specified position. The beam expander 112 expands the laser beam from the laser beam source 111, and the homogenizer 113 homogenizes the light intensity in the plane of the laser beam. Then, the laser beam is irradiated to the phase shifter 114. The excimer laser beam passing through the phase shifter 114 is modulated to become a specified light intensity distribution, and is irradiated to the substrate 130 by the imaging optical system 115.

Also, with respect to the ELA technology of irradiating the laser beam having a uniform intensity distribution onto the amorphous silicon without performing the phase modulation, the following technology is provided. The light irradiating onto the ultraviolet (UV) region is used as the energy light beam for crystallization, and the light irradiating onto the visible light range is used as the illumination light for observation, so as to optically observe the crystallization process.

In FIG. 8, an observation system 120 used to observe the processed region during the crystallization includes an illumination optical system used for observation and a microscopy-observation optical system. The illumination optical system used for observation includes an illumination light source 121 used for observation, a beam expander 122, a half mirror 123, and an annular mirror system 124. The microscopy-observation optical system includes a microscopy-optical imaging system 125, a light detector 126, and a photography apparatus (for example, please refer to patent document 2).

In order to promote crystal growth by heating under a uniform temperature distribution to form relatively large grains, reduce the crystallization defect, and improve the electrical characteristics of the semiconductor film, a technology of irradiating a first energy light beam and a second energy light beam is provided. The first energy light beam causes the semiconductor film to crystallize. Further, the absorption rate of the second energy light beam in the semiconductor film is smaller than the absorption rate of the first energy light beam, and the energy of the second energy light beam is smaller than the energy required for the semiconductor film to crystallize. The second energy light beam reaches till the lower part of the semiconductor film and the substrate, and heats the semiconductor film in the thickness direction of the semiconductor film, so as to heat the substrate, and to reduce temperature difference before and after the irradiation of the first energy light beam. The fact that the excimer laser beam serves as the first energy light beam, and the light including the wavelength component of the visible light range serves as the second energy light beam is disclosed (please refer to patent documents 3 and 4).

In order to maintain the temperature distribution of the heat-processed substrate uniform, it is already known that a cover layer structure is disposed on the upper layer part of the substrate. For the processed substrate, for example, a processed film such as a semiconductor thin film is formed on a basic substrate spaced apart by an insulation film, and a cover film composed of an insulation film is disposed on the processed film. The cover film is used to reduce the heat generated by the heated processed substrate, so as to homogenize the temperature distribution of the processed substrate.

In order to position the grain with high accuracy, it is necessary to accurately project the pattern of the light modulation device on the substrate. But, if the laser beam is continuously irradiated frequently and repeatedly, the environmental temperature of the optical system may rise or heat expansion may occur on the lens system. Therefore, when the laser beam is irradiated, the projection magnification of the pattern, projected onto the substrate, of the light modulation device changes.

It can be ensured through simulation that when a laser with a wavelength of 308 nm is used, if the environmental temperature rises by 3° C., for example, as a telecentric lens with a minification of $1/5$ is used to reduce the pattern of 10 millimeters square of the light modulation device to an area of 2 millimeters square so as to be transferred onto the substrate, and the magnification is changed from $1/5.000$ to $1/4.994$. Thus, an error of approximately 2.4 μm is generated on the periphery of the projection pattern.

In the crystallization region formed by the irradiation of the laser beam, if a transistor is formed across the grain boundary in the subsequent steps, the change of the projection magnification may degrade the switch characteristics.

In the PMELA crystallization technology capable of forming quasi single crystal of several microns, the light modulation device plays an important role in the crystal growth. An important factor of the PMELA crystallization technology is optimizing the shape of the light modulation device. The light intensity distribution of the light modulation device is transferred onto the processed substrate by the excimer laser.

[Non-patent document] Kohki Inoue, Mitsuru Nakada, and Masakiyo Matsumura; Journal of the Institute of Electronic, Information and Communication Engineers Vol.J85-C,N0.8, pp. 624-629, 2002 "Amplitude and Phase Modulated Excimer-Laser Melt-Regrowth Method for Silicon Thin-Films—A New Growth Method of 2-D Position-Controlled Big Grains"

[Patent document 1] Japan patent publication NO. 2006-66462

[Patent document 2] Japan patent publication NO. 2005-294801

[Patent document 3] Japan patent publication NO. 2000-68520

[Patent document 4] Japan patent publication NO. 2002-261015

As described above, in the PMELA crystallization technology, the light modulation device plays an importance role in the crystal growth. An important factor of the PMELA crystallization technology is optimizing the shape of the light modulation device. The light intensity distribution of the light modulation device is transferred onto the processed substrate by the excimer laser.

However, the excimer laser is an UV light, and is a laser irradiating in the form of a pulse. Hence, it is difficult to observe the light intensity distribution formed on the substrate. Therefore, it is impossible to optimize the light modulation device, which is used for obtaining the required crystallization growth.

For the PMELA crystallization technology, patent document 1 has proposed that the optical observation is performed on the crystallized state. For the ELA technology, patent document 2 has proposed that the excimer laser in the UV range is used to perform the crystallization, and the light of the visible light range is used for observation. In the two documents, the states after crystallization are observed. Hence, in order to optimize the shape of the light modulation device according to the observation result, it is necessary to perform in advance the crystallization in the region for the monitoring. After the crystallization state is observed, it is necessary to adjust the light modulation device. Therefore, it is impossible to instantly adjust the light modulation device, and it is impossible to adjust the light modulation device when the processed part is crystallizing.

Also, in order to obtain the uniform temperature distribution, the energy light beam irradiated to the processed region is divided into the first energy light beam for crystallization, and the second energy light beam for heating. The light with smaller absorption rate and smaller energy is used as the second energy light beam for heating (0106, 0115, and 0117 paragraphs in patent documents 3 and 4). Therefore, it is possible to perform the heating without affecting the processed region.

Therefore, the recently provided technologies have the following problems. That is, it is impossible to observe and determine the light intensity distribution of the energy light beam for crystallization under the state of performing the crystallization, and it is impossible to adjust the light modulation device or the metal aperture according to this observation and determination, so as to optimize the light intensity distribution.

The inventor of the application proposed a visualizing apparatus in which light in a visible range is used for the light intensity distribution pattern transferred to the processed substrate, so as to visualize the light intensity distribution. The visualizing apparatus provides a visualization of the light intensity distribution, so as to adjust the light modulation device or a metal aperture forming the light intensity distribution, and to align the position of the optical axis of the light performing the crystallization with the irradiated region.

In the present invention, two kinds of laser beams, i.e., the laser beam in UV range and the laser beam of visible light range, are used as the laser beams for irradiating the processed substrate. The laser beam in UV range is uniformly irradiated to the processed substrate, such that the crystallized region in the processed substrate melts. In the other aspect, the laser beam of visible light range has the energy required by crystallization and has patterned light intensity distribution, such that the light intensity distribution overlaps with the melted region, and the crystal growth is performed in the melted region.

The absorption rate of an amorphous silicon film for the laser beam of visible light range is small. If the laser beam of visible light range having the patterned light intensity distribution is only irradiated on the amorphous silicon film, the absorption rate of the amorphous silicon film is small; thus, it is impossible to crystallize the amorphous silicon film. Therefore, the inventor focuses on the fact that the absorption rate of the melted amorphous silicon film for the laser beam in the visible range being quite large, then the crystallization and the visualization may be achieved at the same time by irradiating the laser beam of visible light range having the patterned light intensity distribution onto the melted amorphous silicon film.

Within the time corresponding to the pulse irradiating time (about 30 nsec) of the excimer laser, the light source of the laser beam in the visible range must apply an energy density (critical fluence) required for damaging a film of the processed substrate and commencing the crystallization. The critical fluence is, for example, an energy density of 100 mJ/cm$^2$.

Therefore, in the crystallization apparatus, in order to use the visible light to perform the crystallization, the visible light capable of obtaining high energy density output is required. If the visible light source is provided, the crystallization and the visualization are realized at the same time.

SUMMARY OF THE INVENTION

Accordingly, the present invention is directed to solve the existing problems and to provide a visible light source capable of obtaining high energy density output in a crystallization apparatus.

The crystallization apparatus provided by the present invention includes: an UV irradiation system, for irradiating pulses of laser beam in the UV range to a processed substrate; a visible light irradiation system, for continuously irradiating a visible light laser beam to an irradiated region, which is the same region irradiated by the laser beam in the UV range, of the processed substrate. In the melted region where the laser beam in the UV range is uniformly irradiated thereto, crystal growth is formed by using the light intensity distribution of the visible light laser beam. The crystallization apparatus of the present invention irradiates pulses of the laser beam in the UV range to melt the processed substrate, and continuously irradiates the visible light laser beam to crystallize the processed substrate, such that the laser beam performing the crystallization is visualized.

The UV irradiation system has an excimer laser beam source and an UV illumination optical system. The UV illumination optical system uniformly irradiates the excimer laser beam emitted by the excimer laser beam source to the substrate. The UV irradiation system uniformly irradiates the excimer laser beam to the substrate, so as to form the melted region on the substrate.

In the other aspect, the visible light irradiation system includes a visible light laser source, a light intensity distribution forming apparatus for patterning the light intensity distribution of the visible light laser beam emitted by the visible light laser beam source, and an imaging optical system for imaging the light with the light intensity distribution patterned by the light intensity distribution forming apparatus onto the irradiating region of the excimer laser beam on the processed substrate.

The visible light irradiation system of the present invention is formed by a plurality of visible laser beam sources arranged in a two-dimensional array. The visible light irradiation system includes a light intensity distribution forming apparatus for patterning light intensity distribution of a plurality of visible laser beams emitted by visible laser beam sources, and an imaging optical system for imaging the light with the light intensity distribution patterned by the light intensity distribution forming apparatus onto the irradiated region on the processed substrate. The visible laser beams emitted by the plurality of solid lasers or semiconductor lasers are overlapped in the light intensity distribution forming apparatus, that satisfies an imaging position relationship in the optical axis with respect to the processed substrate.

The light intensity distribution of the visible laser beams formed by the plurality of visible laser beams emitted by the plurality of visible laser beam sources is irradiated onto the irradiated region melted after being uniformly irradiated by the excimer laser beam in the UV range, such that the excimer laser beam and the visible laser beam are overlapped. The excimer laser beam and the visible laser beam are overlapped, such that the region melted by the excimer laser beam is crystallized. When the excimer laser beam overlaps with the visible laser beam, the plurality of visible laser beams emitted from the plurality of visible laser beam sources are overlapped, and the light intensity distribution of the visible laser beam formed by the overlapping is used to form the crystal growth.

The crystallization apparatus of the present invention overlaps with a plurality of visible laser beams, so as to enhance the homogeneity of the whole light beam and to improve the energy density of the irradiation energy. Moreover, the irradiation energy of the excimer laser beam and the visible laser beam are overlapped, so as to adjust the light intensity having the critical fluence as the minimum energy, and to be used in crystal lateral growth accomplished by using energy gradient.

The absorption rate of the amorphous silicon film in the melting state for the visible light is high. Accordingly, the crystallization can be performed in the region irradiated by the visible light laser beam. Therefore, the region that is undergoing crystallization can be visualized.

The structure of the visible light irradiation system may include a homogenizer disposed between a plurality of visible laser beam sources and the light intensity distribution forming apparatus. The homogenizer can have a plurality of lenses one-to-one corresponding to the plurality of visible laser beam sources.

The light intensity distribution forming apparatus can be a light modulation device or a metal aperture. The light modulation device shifts the phase of the visible light laser beam emitted from the visible light laser beam source, so as to change the light intensity. The metal aperture shields a part of the visible light laser beam emitted by the visible light laser beam source, so as to change the light intensity.

The processed substrate has an amorphous silicon film. The absorption rate of the amorphous silicon film for the excimer laser beam is larger than the absorption rate of the amorphous silicon film for the visible light laser beam, so the excimer laser beam irradiated in the form of a pulse is absorbed by the amorphous silicon film for melting the amorphous silicon film. In the other aspect, before the amorphous silicon film is melted, the absorption rate of the amorphous silicon film for the visible light laser beam is small. Hence, it is not helpful for the crystallization of the amorphous silicon film. However, after the amorphous silicon film is melted, the absorption rate of the amorphous silicon film for the visible light laser beam becomes larger, and the amorphous silicon film is crystallized by the patterned light intensity distribution.

In the crystallization method of the present invention, pulses of the laser beam in the UV range is uniformly irradiated to the amorphous silicon film on the processed substrate for melting the amorphous silicon film. Further, the light intensity distribution of the plurality of visible light laser beams emitted by the plurality of visible laser beam sources is patterned, and the patterned visible light laser beams are irradiated onto the melted liquid silicon region in an overlapping manner to form the crystal growth.

According to the present invention, the visible light source capable of obtaining high energy density output can be formed, and the visible light source can be used as the light source of the crystallization apparatus.

In the crystallization apparatus, the light intensity distribution formed by the light modulation device or the metal aperture and transferred onto the processed substrate is visualized.

Moreover, the light modulation device or the metal aperture is adjusted according to the visualized light intensity distribution.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Implementations of the present invention are illustrated in detail below with reference to the accompanying drawings.

Figure 1:
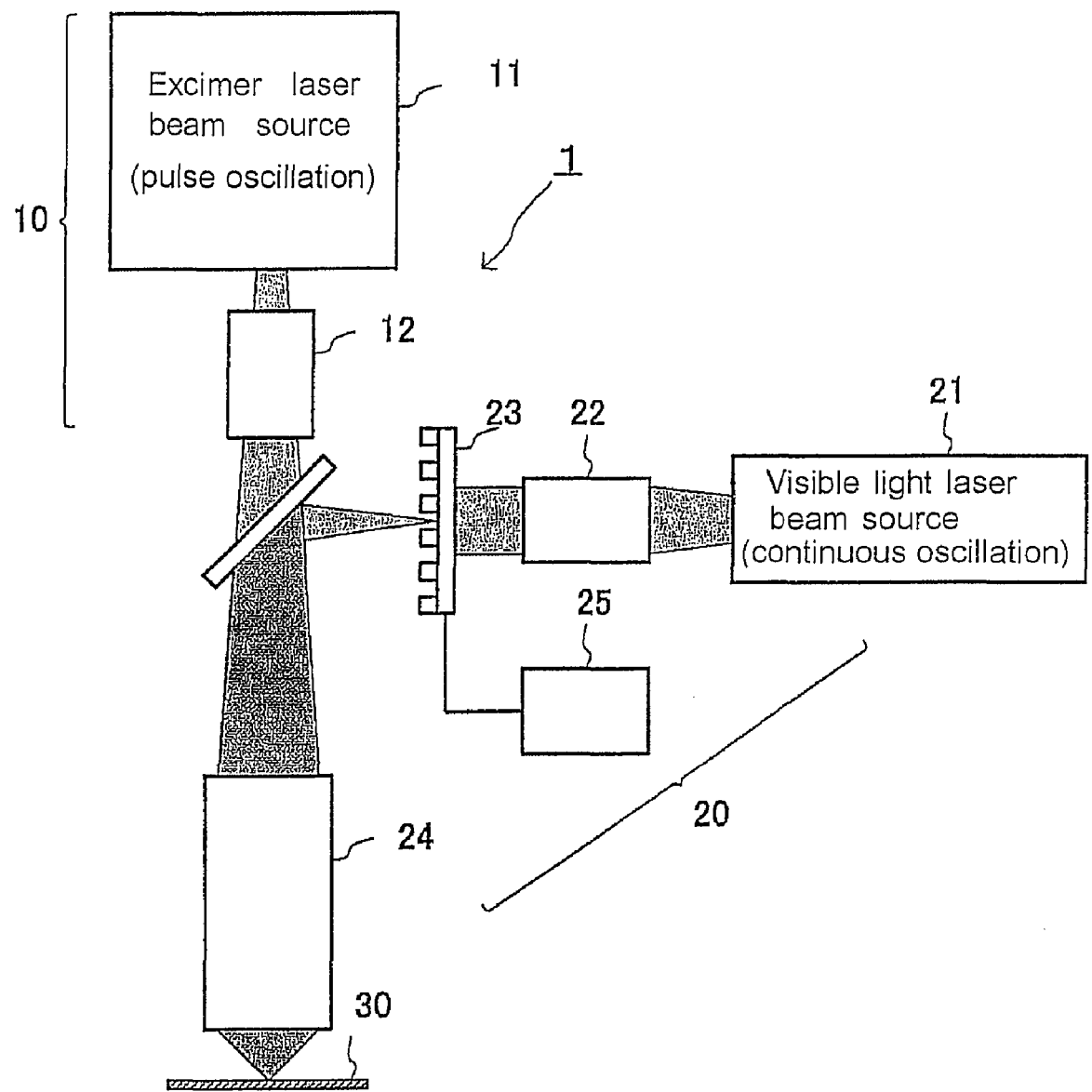
FIG. 1 is a general view of structure of the crystallization apparatus 1 according to the present invention.

FIG. 1 is a schematic view of the structure of a crystallization apparatus 1 according to the present invention. In FIG. 1, the crystallization apparatus 1 of the present invention includes an UV irradiation system 10 and a visible light irradiation system 20. The UV irradiation system 10 irradiates pulses of the laser beam in UV range to a processed substrate 30. The visible light irradiation system 20 continuously irradiates a visible light laser beam to an irradiated region, which is the same region irradiated by the laser beam in the UV range, on the processed substrate 30. The UV irradiation system 10 uniformly irradiates the laser beam in UV range for melting the irradiated region on the processed substrate 30. The visible light irradiation system 20 irradiates the visible light, overlapping with the laser beam in the UV range, onto the melted region, and thereby forming the crystal growth by using the light intensity distribution of the visible laser beam.

The UV irradiation system 10 includes an excimer laser beam source 11 for emitting the excimer laser beam in the form of a pulse, and an UV illumination optical system 12 for irradiating the laser beam. Through an imaging optical system 24 shared with the visible light irradiation system 20, the excimer laser beam is irradiated onto the processed substrate 30, such that the thin film disposed on the processed substrate 30 is melted.

The visible light irradiation system 20 includes a visible light laser beam source 21 for continuously irradiating the visible light laser beam, a visible light illumination optical system 22, a light modulation device 23 for modulating the visible light laser beam irradiated by the visible light illumination optical system 22 to become a light ray having a specified light intensity distribution, an imaging optical system 24 for imaging the modulated light of the light modulation device 23 onto the processed substrate 30, and a positioning stage (not shown) for supporting the processed substrate 30 and determining a two dimensional position on the processed substrate 30. The modulated light irradiated onto the processed substrate 30 through the imaging optical system 24 crystallizes the region, which is melted by the UV irradiation system 10 and disposed in the thin film on the processed substrate 30.

Figure 2:
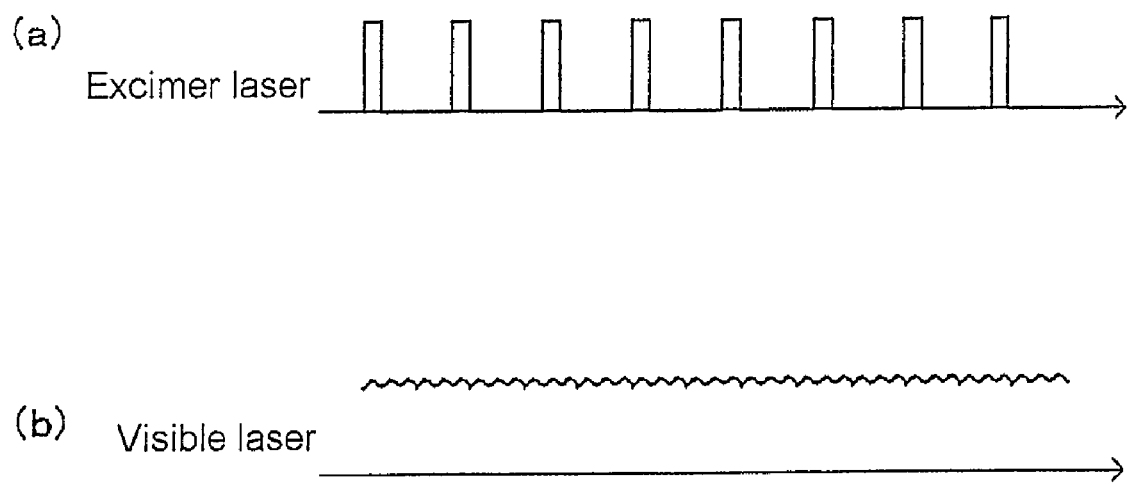
FIGS. 2 (a) and (b) are views of examples of the laser beams of the excimer laser beam source and the visible light laser beam source.

FIG. 2 is a view of an example of the laser beams of the excimer laser beam source and the visible light laser beam source. FIG. 2(a) is an example of the excimer laser beam irradiating the pulsed laser beam. In the other aspect, FIG. 2(b) is an example of the visible light laser beam representing the light intensity distribution and continuously irradiating the laser beam.

The visible light illumination optical system 22 has a beam expander (not shown) or a homogenizer (not shown). The beam expander expands the light beam of the visible light laser beam emitted from the visible light laser beam source 21. The homogenizer homogenizes the light intensity in a plane. The visible light illumination optical system 22 emits and adjusts the laser beam for crystallization, and the laser beam illuminates the light modulation device 23. In addition, the beam expander and the homogenizer are not shown in the drawing.

The light modulation device 23 can use a phase shifter to perform phase modulation on the laser beam for crystallization, so as to modulate the laser beam for crystallization to become a light having an expected light intensity distribution, for example, a light having the light intensity distribution of an inverted wave peak pattern. Moreover, the light intensity distribution is adjusted by the light modulation device 23 via a light modulation device driving mechanism 25.

The imaging optical system 24 minifies the laser beam phase-modulated by the light modulation device 23 for crystallization, and irradiates the laser beam to the non-single crystal semiconductor thin film that will be crystallized. For example, the minification and irradiation can be realized by means of projection, and the projection is achieved by disposing the light modulation device 23 between the illumination optical system 22 and the imaging optical system 24.

In order to crystallize the non-single crystal semiconductor film disposed on the processed substrate 30, for example, in order to crystallize the melted amorphous or polycrystalline semiconductor film, it is necessary for the visible light laser beam source 21 to output a light having sufficient energy, for example, to output a light having 1 J/cm$^2$ on the non-single crystal semiconductor film.

In the other aspect, the excimer laser beam source 11 outputs a short pulse laser beam, for example, a pulse laser beam with a half bandwidth of approximately 25-30 nsec. For the laser beam, for example, KrF excimer laser beam with a wavelength of 248 nm, and XeCl excimer laser beam with a wavelength of 308 nm are preferred. The excimer laser beam source is, for example, an excimer laser beam source of pulse oscillation mode, and the oscillation frequency of the excimer laser beam source of pulse oscillation mode is, for example, 1 Hz to 300 Hz.

The beam expander (not shown) expands the incident visible light laser beam, for example, the beam expander can be composed of a concave lens for expanding the light beam and a convex lens for changing the light beam to a parallel light. The homogenizer (not shown) has the function of determining the size of the incident laser beam on the XY section direction and homogenizing the light intensity distribution in a determined shape. For example, a plurality of X direction cylindrical lenses is arranged along the Y direction to form a plurality of light beams arranged along the Y direction, and an X direction condenser lens is used to converge the light beams on the Y direction, so as to perform the redistribution. Similarly, a plurality of Y direction cylindrical lenses is arranged along the X direction to form a plurality of light beams arranged along the X direction, and a Y direction condenser lens is used to converge the light beams on the X direction, so as to perform the redistribution. The homogenizer adjusts the visible light laser beam to become an illumination light having a specified angle spread and a homogenized light intensity in the cross section.

The phase shifter is an example of the light modulation device 23. For example, a phase shifter is formed by forming step offset on a quartz glass substrate. The laser beam generates diffraction and interference at a boundary of the step offset, and the laser beam intensity is endowed with periodic space distribution. For example, a phase step offset of 180° is formed on left and right sides. The phase shifter with the phase step offset of 180° formed on left and right sides modulates the intensity of the incident light having a homogeneous intensity distribution to become a light intensity distribution of inverted wave peak.

The phase shifter, for example, performs the phase modulation on the incident light, so as to form the light intensity distribution in an inverted wave peak manner to form the step offset and to modulate the phase of the visible light laser beam. Consequently, the intensity distribution of the laser beam that irradiates the semiconductor film becomes the light intensity distribution of the inverted wave peak pattern. The light intensity distribution of the inverted wave peak pattern is formed after intensity modulation is performed for the laser beam at the position corresponding to the phase shift portion (step offset).

The laser beam passing through the phase shifter used as the light modulation device 23 is projected on the processed substrate 30 with a specified light intensity distribution by means of the image optical system 24 that is aberration-modified. The processed substrate 30 is disposed on a conjugated position of the phase shifter (light modulation device 23). The imaging optical system 24 is composed of a group of lenses, for example, including a plurality of CaF$_2$ lenses and synthetic quartz lenses, and the lenses are, for example, single side telecentric lenses with a minification of ⅕, an N.A. of 0.13, a resolution of 2 μm, a focus depth of ±10 μm, and a focal length of 30 mm to 70 mm operation distance.

Also, the metal aperture can be used to replace the light modulation device 23. The phase modulation on the light intensity distribution is performed through the step offset at the edge portion of the aperture portion.

Usually, on the processed substrate 30 after the crystallization process, the non-single crystal semiconductor film (for example, amorphous silicon film, polycrystalline silicon film, silicon film after spray plating, silicon-germanium film, or amorphous silicon film after dehydrogenating process) is formed on a holding substrate separated by an insulation film. The holding substrate is an insulation substrate, such as a glass substrate and a plastic substrate, and a semiconductor substrate (wafer), such as a silicon substrate.

For the film thickness of the non-single crystal semiconductor film, for example, an amorphous silicon film after a dehydrogenating process, the film thickness is 30 nm to 300 nm, for example, 50 nm. The purpose of disposing the insulation film is that, when the non-single crystal semiconductor film is crystallized, undesirable impurities are prevented from diffusing from the holding substrate to the non-single crystal semiconductor film, or Joule heat is prevented from being accumulated due to the irradiation of the laser.

The structure having a cover insulation film is well known. The cover insulation film has the function that the UV light transmission characteristic and heat insulation characteristic of the cover insulation film for the laser beam are used to accumulate the heat when the non-single crystal semiconductor film is irradiated by the laser beam and is melted, so as to achieve the crystallization. With the heat accumulation effect of the cover insulation film, the crystallization of grains with large diameter (larger than or equal to 5 μm) in the melted region of the non-single crystal semiconductor film is achieved in the crystallization apparatus having the current structure. The cover insulation film is used to improve the crystallization efficiency. The crystallization apparatus of the present invention can perform the melting and the crystallization in the same region; hence, the application of cover film can be unnecessary. The cover film is composed of the insulation film, which is disposed on the non-single crystal semiconductor film of the processed substrate 30 for maintaining the heating state.

The crystallization apparatus 1 of the present invention can also have the positioning stage (not shown). In addition to an XY stage (not shown), the positioning stage also has a position determination portion (not shown), in which the XY stage carries the processed substrate 30 and freely moves on the two dimensional plane in XY direction, and the position determination portion determines the two dimensional plane position on the XY stage. The XY stage includes an X axis stage moving along the X axis direction, a Y axis stage moving along the Y axis direction, and a surface plate (not shown) supporting the X axis stage and the Y axis stage. The processed substrate 30 is carried on the XY stage, and is positioned by moving the XY stage on the two-dimensional plane.

When the crystallization apparatus 1 of the present invention is used to crystallize the processed substrate 30, a stage driving control apparatus (not shown) is used to drive the XY stage for the laser beam to scan the processed substrate 30, such that the processed substrate 30 is crystallized.

Figure 3:
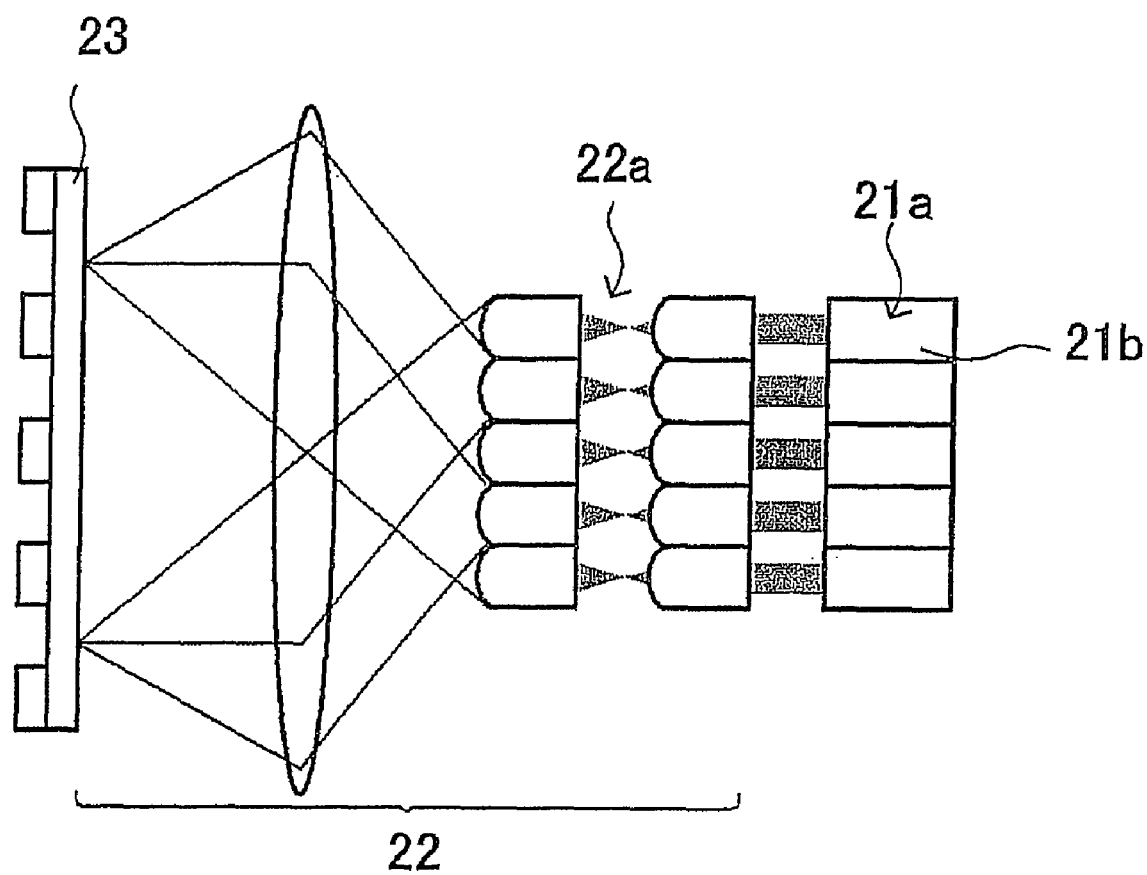
FIG. 3 is a sectional view of the structure of the visible laser beam source and the visible light illumination optical system used in the crystallization apparatus of the present invention.
Figure 5:
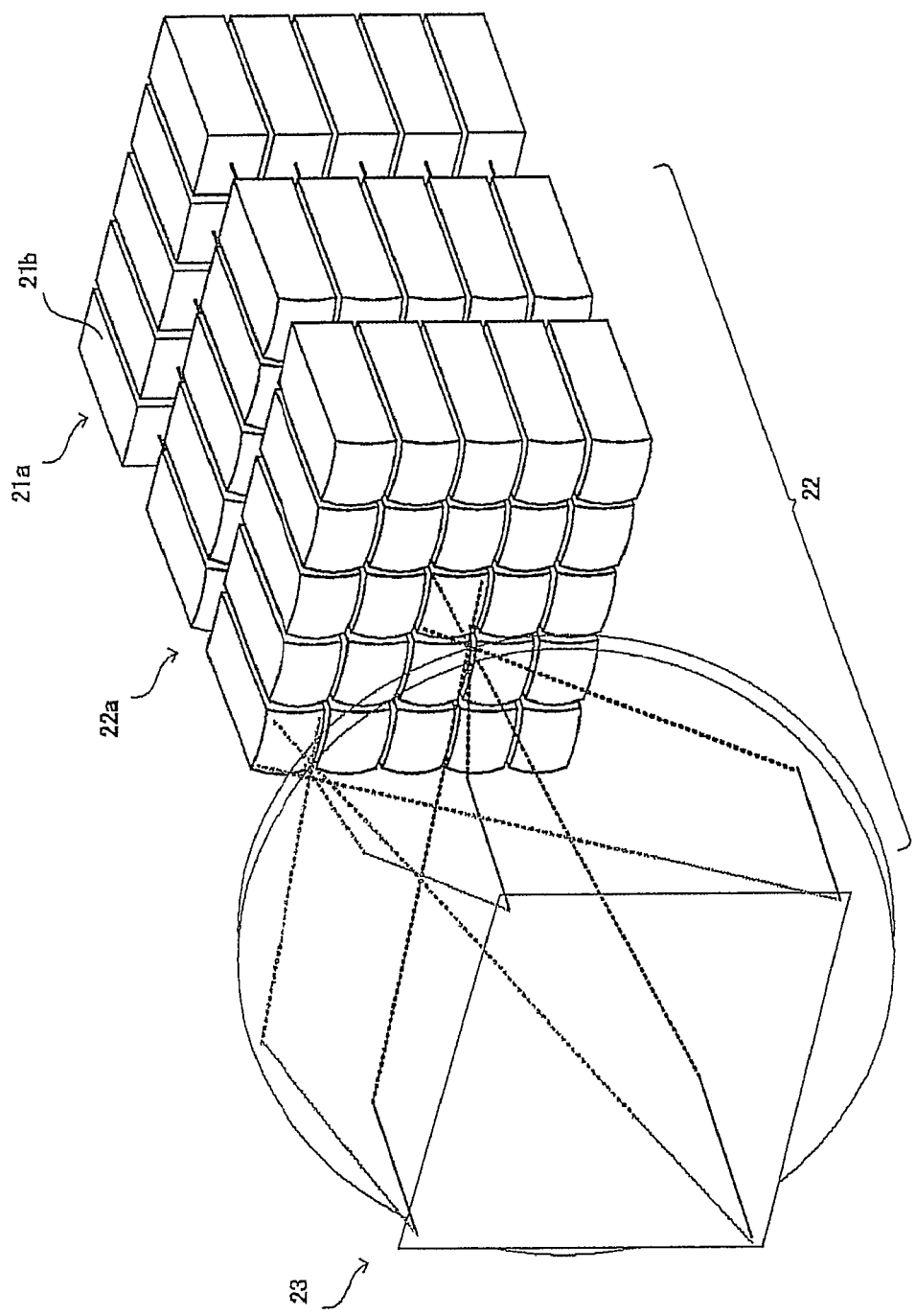
FIG. 5 is a perspective view of the structure of the visible laser beam source and the visible light illumination optical system used in the crystallization apparatus of the present invention.

FIG. 3 is a sectional view of the structure of the visible laser beam source and the visible light illumination optical system used in the crystallization apparatus of the present invention, and FIG. 5 is a perspective view of the structure.

The visible laser beam source 21 of the present invention is composed of a two-dimensional array light source 21a. A plurality of light source units 21b, such as solid laser beam sources or semiconductor laser beam sources, is arranged in a two-dimensional array, so as to form the two-dimensional array light source 21a. A visible light illumination optical system 22 is disposed on a light path between the two-dimensional array light source 21a and the light modulation device 23. The visible light illumination optical system 22 overlaps the visible laser beams emitted by the light source units 21b of the two-dimensional array light source 21a toward the light modulation device 23 that satisfies the imaging position relationship in the optical axis with respect to the processed substrate 30.

Figure 4:
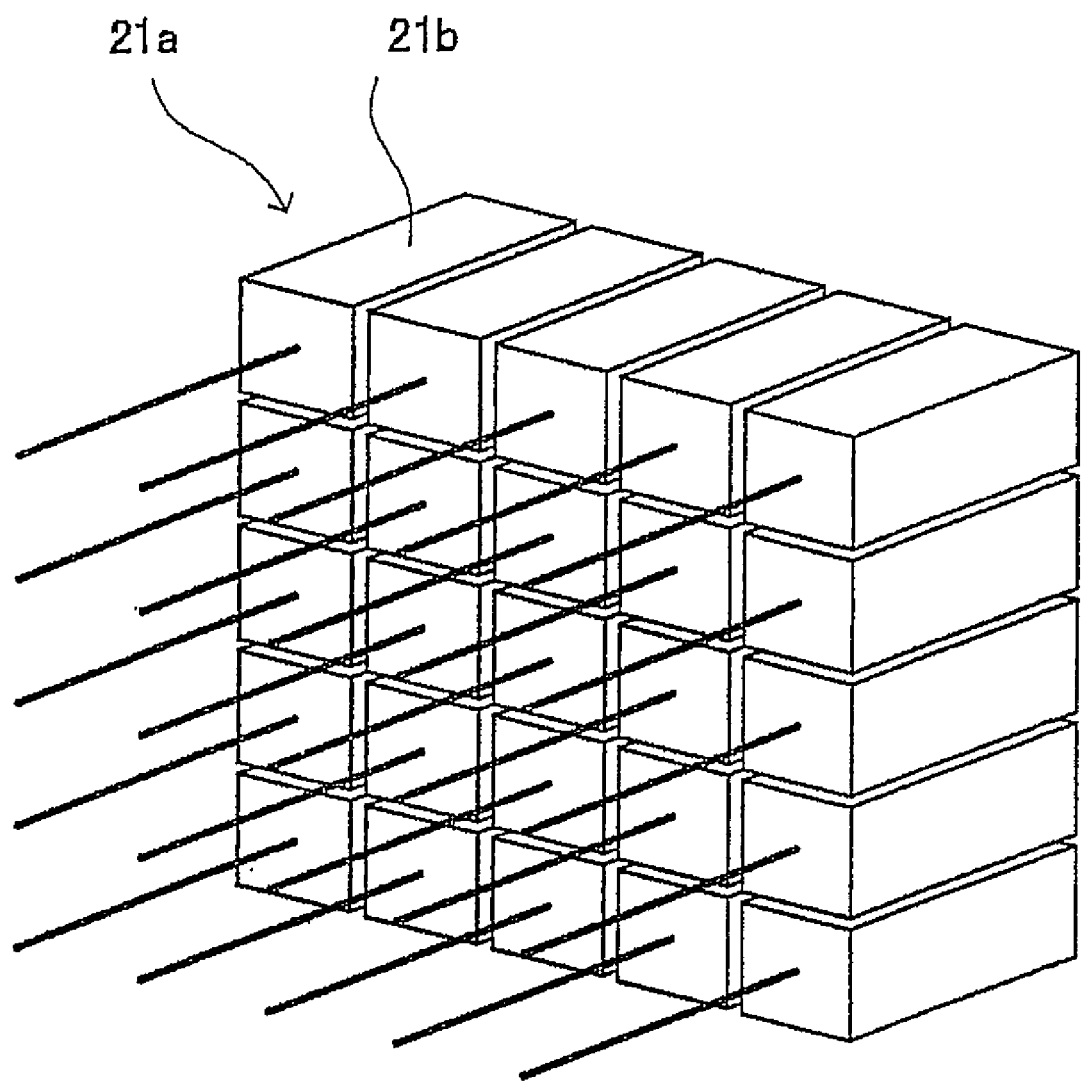
FIG. 4 is a view of a construction example of the two-dimensional array light source of the present invention.

FIG. 4 represents a construction example of the two-dimensional array light source 21a. Here, as an example, 5 light source units 21b are arranged longitudinally and laterally in an array manner, so as to form the two-dimensional array light source 21a. In addition, the number of the arranged light source units is not limited to 5, and can be any specified number.

The visible light illumination optical system 22 has a homogenizer 22a, so as to form a homogenized illumination optical system. The homogenizer 22a can be a cylindrical lens or a fly-eye lens. In FIG. 5, the continuous laser beams of visible light emitted from the light source units 21b are irradiated through the homogenizer 22a to the position on the light modulation device 23, that satisfy the imaging position relationship in the optical axis with respect to the processed substrate 30. A plurality of laser beams generated from the light source units 21b is overlapped in the light modulation device 23. The laser beams from the plurality of light source units 21b are overlapped, so as to reduce the change resulted from the inhomogeneity of the light source unit 21 band to improve the energy density.

For example, a YAG laser with a wavelength of 532 nm and a power of 15 W is used as the light source unit 21b of the visible light source. In a structure having an arrangement of the light source units 21b in a 5*5 array, the estimation of the energy density is described below when the transmission rate of the whole optical system is set to be 40%. If the energy injected into the substrate is converted with the irradiation time of the excimer laser beam (30 nsec), then the estimation of the energy density is 25*15(W)*30 E−9*0.4(J)=4500(nJ). When the laser beam is irradiated on the 2 mm*2 mm region on the substrate, the energy density (fluence) is 4.5/0.04=112 (mJ/cm$^2$).

Further, the fluence (critical fluence) required for damaging the film at the commencement of the crystallization is assumed to be 200 mJ/cm$^2$ of the excimer laser irradiation. In addition, the critical fluence also depends on the structure of the film of the processed substrate.

Therefore, in the crystallization apparatus of the present invention, the irradiation energy of the visible light overlaps with the irradiation energy of the excimer laser. Therefore, the critical fluence of 200 mJ/cm$^2$ of the excimer laser is set to be the minimum energy density, and the energy density generated by irradiating the visible laser beam is set to be an adjustable amount, so as to perform the light intensity modulation in a scope of 200-312 mJ/cm$^2$.

The light intensity modulation is performed along the moving direction of the substrate, so as to form an energy gradient, and the energy gradient can be applied in the crystal lateral growth.

Figure 6:
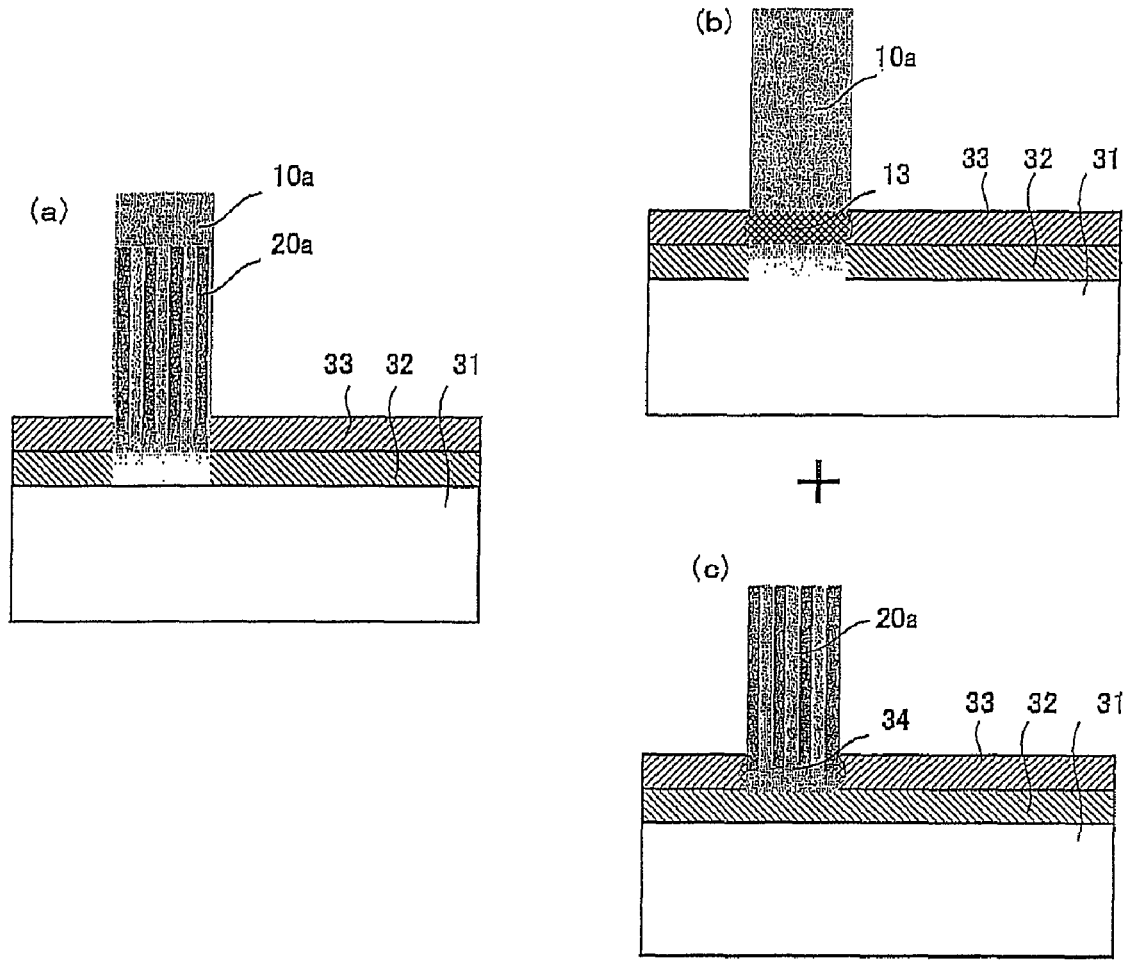
FIGS. 6 (a), (b) and (c) are views illustrating the melting and the crystallization by overlapping the excimer laser beam and the visible light laser beam.
Figure 7:
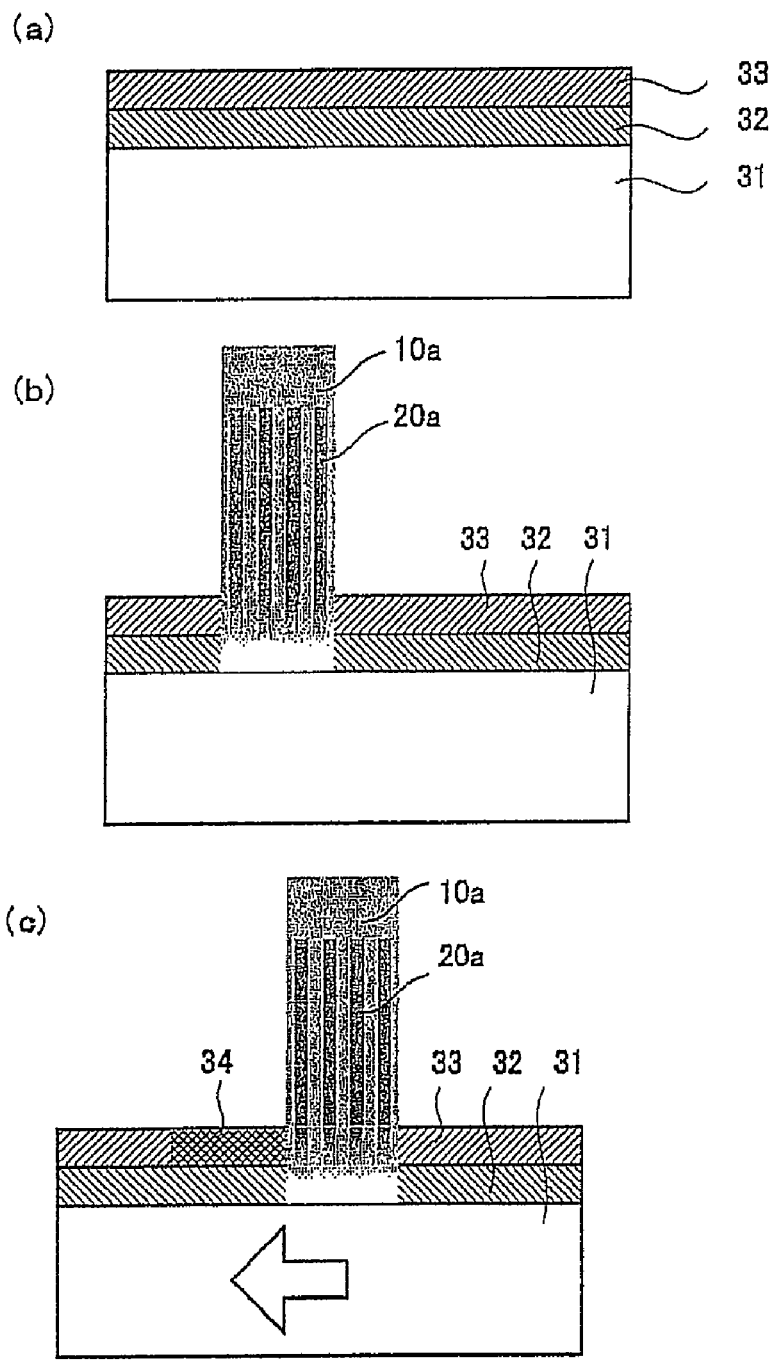
FIGS. 7 (a), (b) and (c) are views illustrating the melting and the crystallization by overlapping the excimer laser beam and the visible light laser beam.
Figure 8:
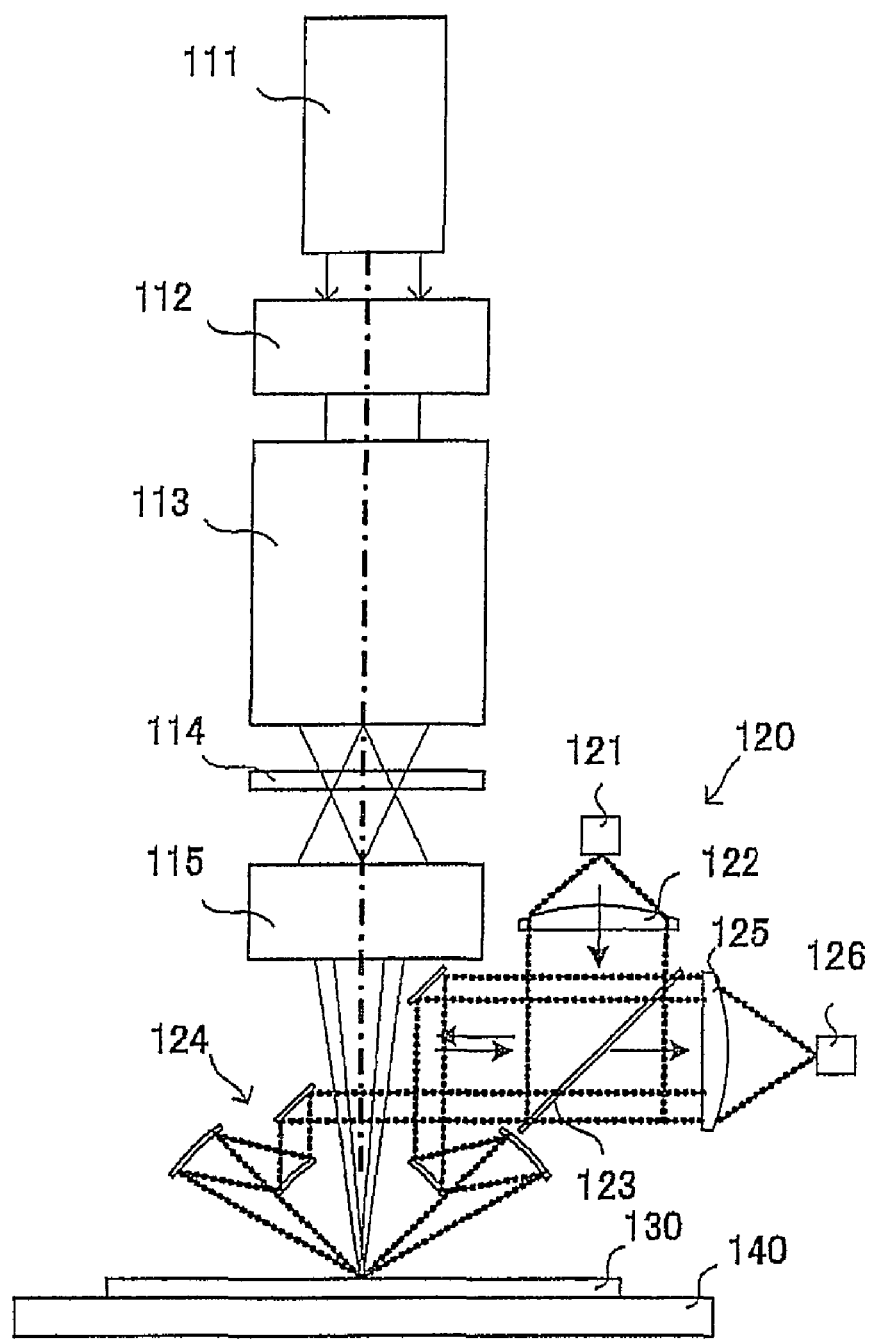
FIG. 8 is a view of a construction example of a crystallization apparatus for crystallizing by using PMELA.

FIGS. 6 and 7 are views illustrating the melting and the crystallization by overlapping the excimer laser beam and the visible light laser beam.

On a basic substrate 31 of the processed substrate 30, an amorphous silicon film is disposed to serve as an insulation film 32 and a processed film 33. An excimer laser beam 10a and a visible light laser beam 20a are irradiated onto the processed substrate 30 in an overlapping manner. The excimer laser beam 10a is irradiated in a pulsed irradiation manner. The wavelength of the excimer laser is short, so the absorption rate thereof in the amorphous silicon film is high and the depth of entering the processed substrate 30 is shallow; thus, it is possible to melt the amorphous silicon film.

In the other aspect, the absorption rate of the continuously irradiating visible light laser beam 20a in the amorphous silicon film is small. Hence, the depth of entering the processed substrate 30 is deep, and it is possible to reach further to the lower layer as compared with the amorphous silicon film, such that the energy injected into the processed substrate 30 can be diffused.

When the excimer laser beam 10a and the visible light laser beam 20a are irradiated in an overlapping manner, before the amorphous silicon film is melted, the absorption rate of the visible light laser beam 20a in the amorphous silicon film is small. Thus, the visible light laser beam 20a can pass through the layer of the amorphous silicon film, such that it is impossible to crystallize the amorphous silicon film. In contrast, under the state that the amorphous silicon film is melted, the absorption rate of the visible light laser beam 20a in the amorphous silicon film is large, so the visible light laser beam 20a is absorbed in the layer of the amorphous silicon film for the amorphous silicon film to crystallize.

FIG. 6(a) represents the state of irradiating the excimer laser beam 10a and the visible light laser beam 20a in an overlapping manner, FIG. 6(b) represents the irradiating state of the excimer laser beam 10a, and FIG. 6(c) represents the irradiating state of the visible light laser beam 20a. In FIG. 6(b), the region 13 of the amorphous silicon film 33 is irradiated by the excimer laser beam 10a to become melted. In FIG. 6(c), the visible light laser beam 20a is irradiated on the melted region 13, such that it is crystallized.

FIG. 7 represents the state of moving the position irradiated by the excimer laser beam 10a and the visible light laser beam 20a in an overlapping manner, so as to promote the crystallization process on the processed substrate 30. FIG. 7(a)

represents the state before the irradiation of the laser beam. In FIG. 7(b), the excimer laser beam 10a and the visible light laser beam 20a are irradiated in an overlapping manner to crystallize the irradiated position. In FIG. 7(c), the excimer laser beam 10a and the visible light laser beam 20a are moved on the processed substrate 30, such that the excimer laser beam 10a and the visible light laser beam 20a irradiate onto the next irradiated position in an overlapping manner to perform the crystallization.

According to the present invention, a plurality of cheap visible light sources is used to constitute a two-dimensional array light source to resolve the problem of an insufficient amount of light resulted from a single light source.

When the current excimer laser beam is used to perform the crystallization, a strong pulse light is irradiated in a short time of, for example, 30 ns; thus, it is necessary to use the cover layer to seal the heat energy. However, according to the crystallization apparatus of the present invention, the visible laser beam can be used to crystallize the region melted because of the excimer laser beam; thus, the step of forming initial films, such as the cover film on the substrate, can be omitted.

According to the crystallization apparatus of the present invention, the light modulation device of the visible light is used to facilitate the observation of the light intensity distribution and the processing of the light modulation device.

According to the crystallization apparatus of the present invention, the optical axis of the optical system is adjusted under the continuous oscillation of the visible light laser beam. Hence, it is easy to perform maintenance and management for the apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A crystallization apparatus, comprising:
    an ultraviolet (UV) irradiation system, for irradiating pulses of a laser beam in an UV range to a region of a processed substrate; and
    a visible light irradiation system, for continuously irradiating a visible laser beam to an irradiated region, which is the same region irradiated by the laser beam in the UV range, on the processed substrate, and
    wherein the visible light irradiation system comprises a plurality of visible laser beam sources arranged in a two-dimensional array,
    in a melted region resulted from a uniform irradiation of the laser beam in the UV range, a light intensity distribution of the visible laser beam is used to form a crystal growth, and the light intensity distribution of the visible laser beam is formed by overlapping a plurality of visible laser beams emitted from the plurality of visible laser beam sources.

2. The crystallization apparatus as claimed in claim 1, wherein:
    the UV irradiation system comprises an excimer laser beam source and an UV illumination optical system, the UV illumination optical system uniformly irradiates an excimer laser beam emitted by the excimer laser beam source onto the substrate,
    the visible laser beam source is a solid laser or a semiconductor laser,
    the visible light irradiation system comprises a light intensity distribution forming apparatus, and an imaging optical system, the light intensity distribution forming apparatus patterns the light intensity distribution of the plurality of visible light laser beams emitted by the visible light laser beam sources, the imaging optical system images the light having the light intensity distribution patterned by the light intensity distribution forming apparatus onto the irradiated region on the processed substrate, and
    the visible laser beams emitted by a plurality of solid lasers or semiconductor lasers are overlapped into the light intensity distribution forming apparatus that satisfies the imaging position relationship in an optical axis with respect to the processed substrate.

3. The crystallization apparatus as claimed in claim 2, wherein:
    in the visible light irradiation system, a homogenizer is disposed between the plurality of visible laser beam sources and the light intensity distribution forming apparatus.

4. The crystallization apparatus as claimed in claim 3, wherein:
    the homogenizer comprises a plurality of lenses one-to-one corresponding to the plurality of visible laser beam sources.

5. A crystallization method, comprising:
    uniformly irradiating pulses of a laser beam of an UV range onto an amorphous silicon film on a processed substrate, so as to melt the amorphous silicon film,
    overlapping a plurality of visible laser beams emitted from a plurality of visible laser beam sources into a light intensity distribution forming apparatus,
    patterning a light intensity distribution of the overlapped visible laser beams by means of the light intensity distribution forming apparatus,
    irradiating the patterned visible laser beams onto the melted liquid silicon region in an overlapped manner, so as to form a crystal growth.

* * * * *